United States Patent [19]
Honma et al.

[11] Patent Number: 5,706,965
[45] Date of Patent: Jan. 13, 1998

[54] EXPANDABLE HOUSING ASSEMBLY FOR ELECTRONICS CIRCUITRY

[75] Inventors: Tomoyuki Honma; Kazuhisa Yoshizawa, both of Tokyo, Japan

[73] Assignee: NEC Corporation, Tokyo, Japan

[21] Appl. No.: 718,195

[22] Filed: Sep. 19, 1996

[30] Foreign Application Priority Data

Sep. 19, 1996 [JP] Japan ................................ 7-239676

[51] Int. Cl.$^6$ ................................................ B65D 21/00
[52] U.S. Cl. ................ 220/4.02; 220/4.26; 220/4.27; 220/23.6; 206/501; 206/509
[58] Field of Search ...................... 220/4.02, 4.26, 220/4.27, 23.6; 206/501, 509

[56] References Cited

U.S. PATENT DOCUMENTS

| T947,001 | 6/1976 | Mavredes | 220/23.6 |
|---|---|---|---|
| 3,103,278 | 9/1963 | Kuzma et al. | 220/23.6 |
| 4,660,724 | 4/1987 | Gaynes | 206/509 |
| 4,978,023 | 12/1990 | Behlmann et al. | 220/23.6 |
| 5,040,681 | 8/1991 | Grusin | 206/509 |
| 5,217,507 | 6/1993 | Sprig | 220/23.6 |

Primary Examiner—Joseph M. Moy
Attorney, Agent, or Firm—Whitham, Curtis, Whitham & McGinn

[57] ABSTRACT

A housing assembly includes a high-profile basic unit and low-profile expansion unit. The basic unit has a recessed portion on its upper surface and a pair of grooves respectively extending vertically along its opposite sidewalls. A pair of connecting members equal in length to the grooves of the basic unit are normally received into these grooves. The expansion unit is formed on its bottom surface with a base portion and a pair of grooves respectively extending vertically along its opposite sidewalls. The base portion of the expansion unit is engageable into the recessed portion of the basic unit. The grooves of both basic and expansion units have an equal width. A pair of vanity members equal in length to the grooves of the expansion unit are normally fitted into these grooves. The arrangement is such that, when the expansion unit is mounted on the basic-unit, the base portion of the expansion unit fits into the recessed portion of the basic unit and the grooves of the basic unit are aligned vertically with the grooves of the expansion unit, so that the connecting members can be engaged into the aligned grooves and fastened to the expansion unit and the basic unit and the vanity members can be engaged into the grooves of the basic unit and fastened thereto.

4 Claims, 3 Drawing Sheets

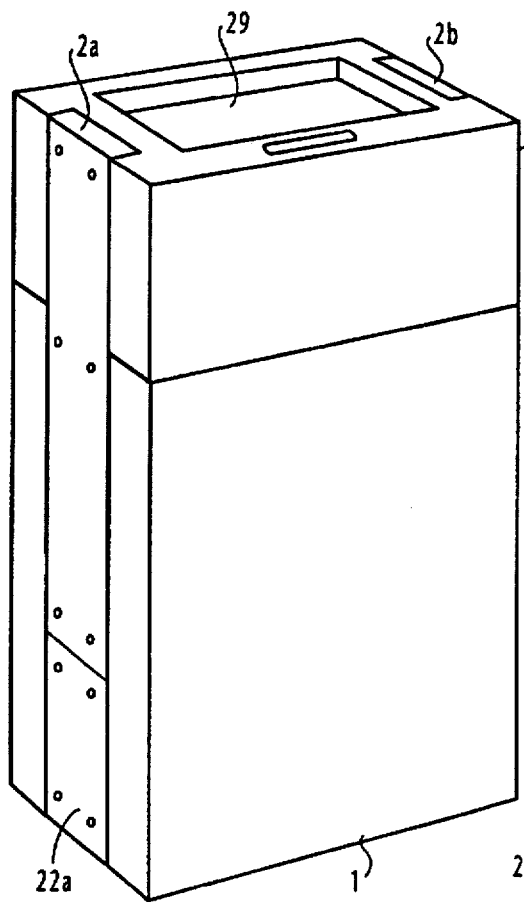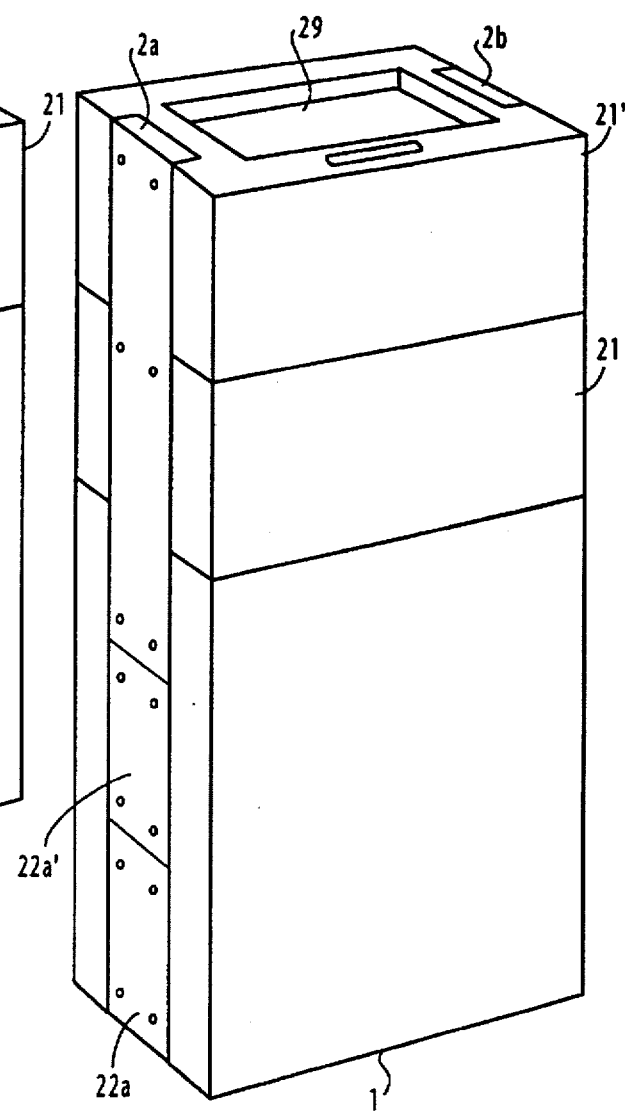

EXPANDABLE HOUSING ASSEMBLY FOR ELECTRONICS CIRCUITRY

BACKGROUND OF THE INVENTION

1. Field of the Invention

The present invention relates generally to housing structures, and more specifically to an expandable assembly for electronics circuitry.

2. Description of the Related Art

In the past, when a need arises to expand the capacity of an electronics system with the system growth, it was achieved by mounting an expansion unit on top of a basic unit and securing them together with the use of connecting panels fastened to the sidewalls of both units with screws. The expansion unit must be positioned precisely so that both units are vertically aligned together to present flat side surfaces. However, the prior an positioning was done manually by inspection and hence it was a time consuming job.

SUMMARY OF THE INVENTION

It is therefore an object of the present invention to provide an expandable housing assembly which enables precision positioning of basic and expansion units in a short period of time.

According to the present invention, there is provided an expandable housing assembly for electronics circuitry. The assembly comprises a basic unit having a recessed portion on an upper surface thereof and a pair of grooves respectively extending vertically along opposite sidewalls thereof. A pair of connecting members are provided, which are equal in length to the grooves of the basic unit and respectively engageable thereinto. The assembly has an expansion unit which is formed on the bottom surface with a base portion which extends from the bottom surface. The expansion unit is formed with a pair of grooves respectively extending vertically along its opposite sidewalls. The base portion of the expansion unit is engageable into the recessed portion of the basic unit. The grooves of the basic unit and the grooves of the expansion unit have an equal width. Further provided is a pair of vanity members equal in length to the grooves of the expansion unit, which are respectively engageable into the grooves of the expansion unit. Normally, the connecting members are received in the grooves of the basic unit and the vanity members are received in the grooves of the expansion unit. The arrangement is such that, when the expansion unit is mounted on the basic unit, the base portion of the expansion unit fits into the recessed portion of the basic unit end the grooves of the basic unit are aligned vertically with the grooves of the expansion unit, so that the connecting members can be engaged into the aligned grooves and fastened to the expansion unit and the basic unit and the vanity members can be engaged into the grooves of the basic unit and fastened thereto.

The extension unit may be formed with a recessed portion on its upper surface identical to the recessed portion of the basic unit for receiving the base portion of another extension unit. In a preferred embodiment, the connecting members are respectively formed with flange portions, and the basic unit is formed with a pair of recesses respectively adjacent to upper ends of the grooves of the basic unit and the expansion unit is formed with a pair of recesses respectively adjacent to upper ends of the grooves of the expansion unit. The flange portions of the connecting members are respectively engageable with the recesses of the extension unit when the connecting members are respectively engaged into the aligned grooves. In addition, the height of the basic unit may be a submultiple of the height of the expansion unit.

BRIEF DESCRIPTION OF THE DRAWINGS

The present invention will be described in further detail with reference to the accompanying drawings, in which:

FIG. 4 is a perspective view of an expanded form of the basic unit using one expansion unit mounted on the basic unit; and FIG. 5 is a perspective view of an expanded form of the basic unit using two expansion units mounted on the basic unit.

DETAILED DESCRIPTION

Figure 1:
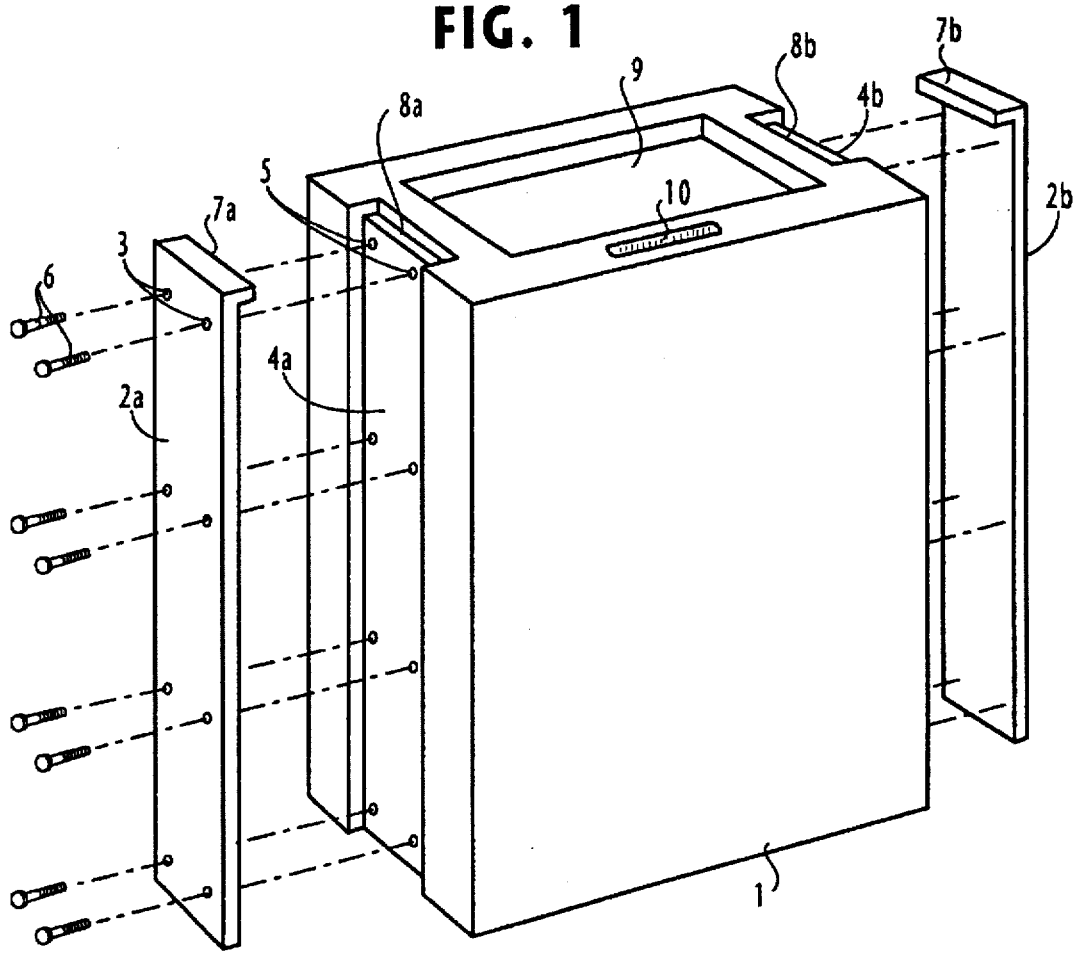
FIG. 1 is a partially exploded perspective view of a basic unit of the present invention.

In FIG. 1, there is shown a basic unit of the present invention. The basic unit comprises a housing 1 for containing electronics circuitry or communications apparatus, and a pair of connecting panels 2a and 2b each being formed with a plurality of throughholes 3. Housing 1 is formed with a pair of grooves 4a and 4b vertically extending along opposite walls from the top to the bottom of the housing. A plurality of threaded holes 5 are provided in the grooves 4a, 4b. When no expansion unit is provided, the connecting panels 2a and 2b are fitted into the grooves 4a and 4b, respectively, by tightening screws 6 with corresponding threaded holes 5 via throughholes 3. The upper end of connecting panel 2a is formed with a flange 7a which engages a recessed portion 8a of the housing adjacent the upper end of groove 4a. Likewise, the connecting panel 2b is formed with a flange 7b for engaging a recessed portion 8b of the housing adjacent the upper end of groove 4b. The upper surface of housing 1 has a recessed portion 9. Adjacent to the recessed portion 9 is a female connector 10 having a plurality of terminal pins for electrical connection of the internal electronics circuitry to the internal electronics circuitry of the expansion unit.

Figure 2:
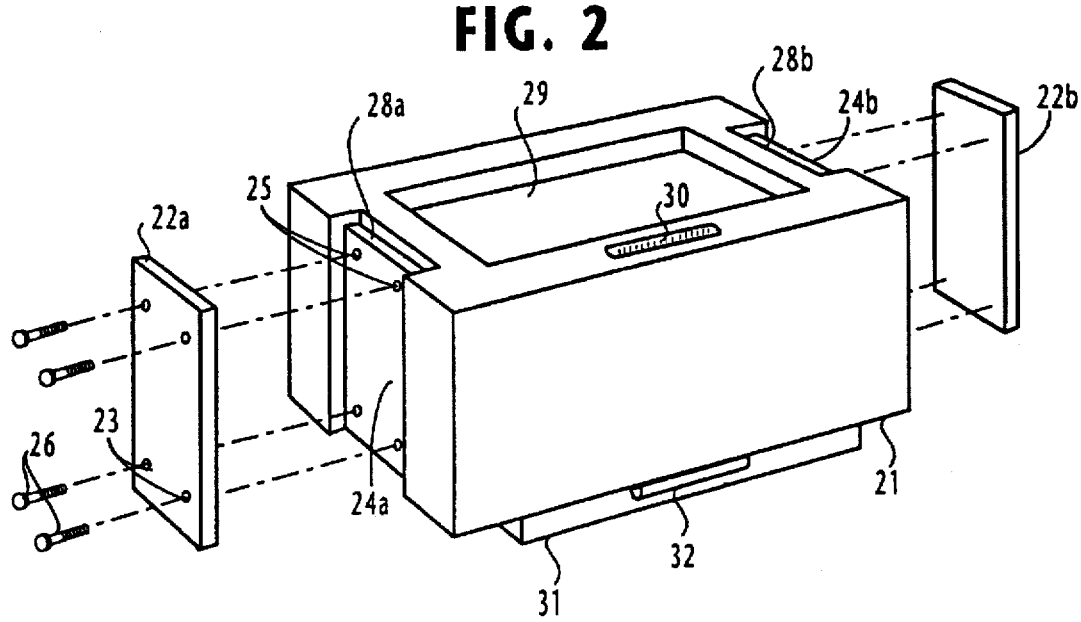
FIG. 2 is a partially exploded perspective view of an expansion unit of the present invention.
Figure 3:
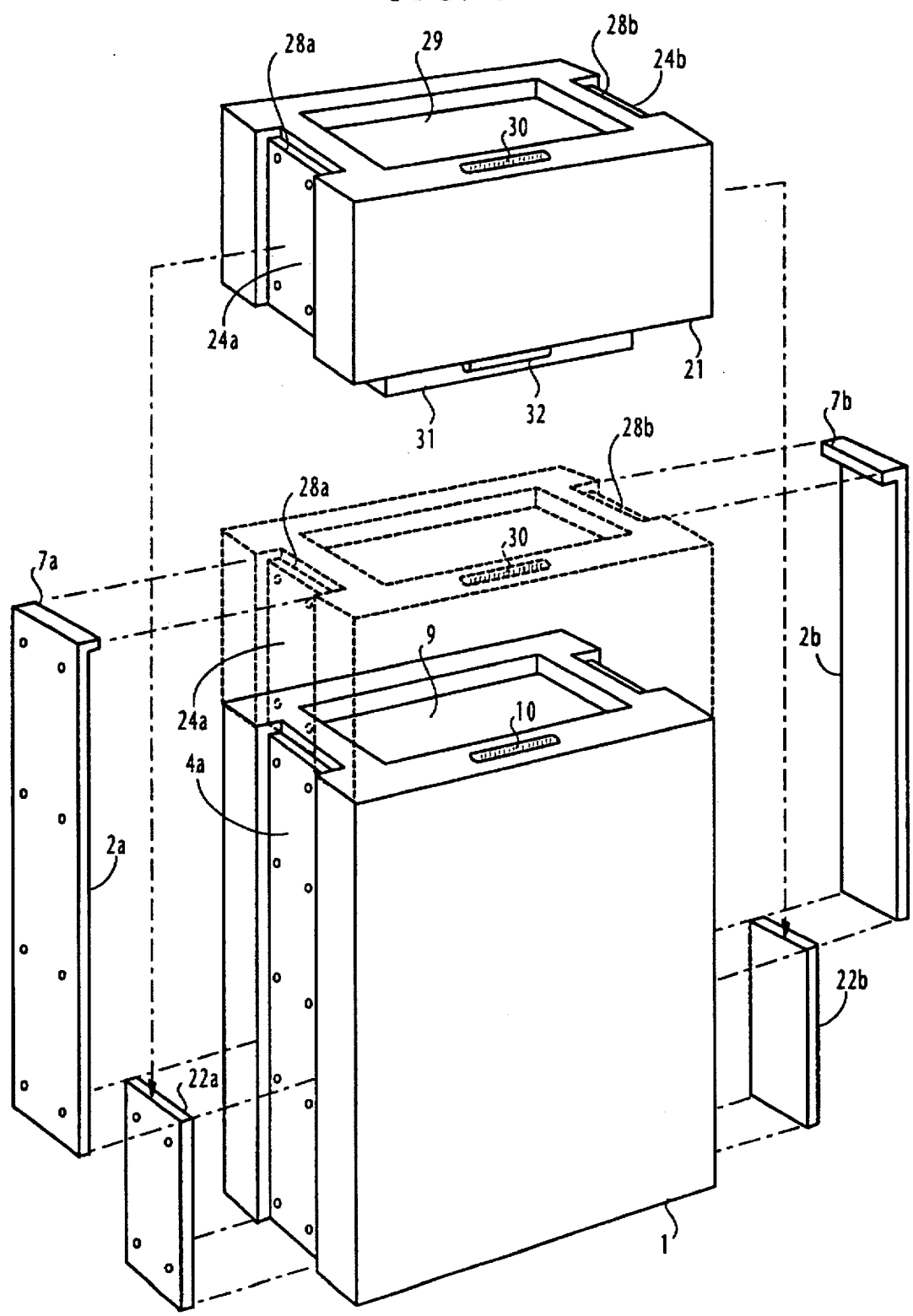
FIG. 3 is an exploded perspective view of the basic and expansion units illustrating their relative positions when mounting the expansion unit on the basic unit.

The expansion unit is generally a low-profile version of the basic unit. As illustrated in FIG. 2, the expansion unit comprises a housing 21 and a pair of vanity panels 22a and 22b each being formed with a plurality of throughholes 23. Housing 21 contains electronic circuitry adapted for connection with the electronics circuitry of the basic unit to extend the capacity of the basic unit. The height of expansion housing 21 is preferably a submultiple of the height of the basic housing 1 and the length of the vanity panels is preferably the same submultiple of the length of the connecting panels 2a, 2b. Housing 21 is formed with a pair of grooves 24a and 24b for receiving the vanity panels 22a, 22b. The width of each groove 24 is the same as that of the grooves 2 of the basic unit. A plurality of threaded holes 25 are provided in the grooves 24a, 24b. When the expansion unit is shipped to the site of the basic unit, the panels 22a and 22b may be fitted into the grooves 24a and 24b, respectively, by tightening screws 26 with corresponding threaded holes 25 via throughholes 23. Housing 21 has recessed portions 28a and 28b for receiving the flange portions 7a and 7b of the connecting panels 2a, 2b, respectively. The upper surface of housing 21 has a recessed portion 29. Adjacent to the recessed portion 29 is a female connector 30 having a plurality of terminal pins for electrical connection of the internal electronics circuitry to the electronic circuitry of another expansion unit which may be mounted on the housing 21.

On the bottom of the housing 21 is formed a base portion 31 which is shaped so that, when the expansion unit is mounted on the basic unit, it snugly fits into the recessed portion 29 of the basic unit. Adjacent to a side wall of the base portion 31 and secured to the bottom of housing 21 is a male connector 32 which is brought into contact with the female connector 10 of the basis unit when the expansion unit is mounted on the basic unit.

When mounting the expansion unit on the basic unit, the side panels 2a, 2b are disassembled from housing 1 and the vanity panels 22a, 22b are disassembled from housing 21. As shown in FIG. 5, when the expansion-unit housing 21 is placed on the basic-unit housing 1, the base portion 31 of the expansion unit is secured in the recessed portion 9 of the basic unit and the male and female connectors 10 and 32 are connected together. In addition, the side grooves 4 of the basic unit are vertically aligned with the side grooves 24 of the expansion unit. Into these aligned grooves are fitted the connecting panels 2a and 2b disassembled from the basic unit such that their flange portions 7a and 7b are received in the recessed portions 28a and 28b of the expansion unit, respectively. Therefore, the connecting panels 2a and 2b cover the whole length of the grooves 24 of the upper expansion unit and partially cover the grooves 4 of the lower basic unit, thus leaving lower portions which are equal in length to the vanity panels 22a, 22b dissembled from the expansion unit. The vanity panels 22a and 22b are then fitted into the lower remainder portions of the grooves 4 of the basic unit.

As shown in FIG. 4, the panels fitted into the aligned grooves are tightly fastened in place by using the screws 6. As a result, the lower ends of connecting panels 2 and the upper ends of vanity panels 22 are brought into abutment contact, presenting a seamless-looking joint and a flat vertical surface. With the panels 2 being tightly fastened into place, their flange portions 7a and 7b are engaged with the recessed portions 28a, 28b of the expansion unit so that the basic and expansion units are rigidly held together.

The recessed portion 29 of the expansion unit allows it to engage with the base portion of another expansion unit 21' so that more than one expansion unit can be stacked on the basic unit as shown in FIG. 5. In such instances, the fixing panels 2a, 2b are raised in position to accommodate the second expansion unit 21' and a vanity panel 22a', disassembled from the second expansion unit 21', is fastened to the basic unit between the panels 2a and 22a.

What is claimed is:

1. An expandable housing assembly for electronics circuitry, comprising:
    a basic unit having a recessed portion on an upper surface thereof and a pair of grooves respectively extending vertically along opposite sidewalls thereof;
    a pair of connecting members equal in length to said grooves of the basic unit and respectively engageable thereinto;
    an expansion unit having a base portion on a bottom surface thereof and a pair of grooves respectively extending vertically along opposite sidewalls thereof, the base portion of the expansion unit being engageable into the recessed portion of the basic unit, the grooves of the basic unit and the grooves of the expansion unit having an equal width; and
    a pair of vanity members equal in length to said grooves of the expansion unit and respectively engageable thereinto,
    the arrangement being such that, when the expansion unit is mounted on the basic unit, said base portion of the expansion unit fits into the recessed portion of the basic unit and the grooves of the basic unit are aligned vertically with the grooves of the expansion unit, so that said connecting members can be engaged into the aligned grooves and fastened to the expansion unit and the basic unit and the vanity members can be engaged into the grooves of the basic unit and fastened thereto.

2. An expandable housing assembly as claimed in claim 1, wherein said extension unit is formed with a recessed portion on an upper surface thereof identical to the recessed portion of the basic unit for receiving the base portion of another extension unit.

3. An expandable housing assembly as claimed in claim 1, wherein the connecting members are respectively formed with flange portions, and wherein said basic unit is formed with a pair of recesses respectively adjacent to upper ends of the grooves of the basic unit and said expansion unit is formed with a pair of recesses respectively adjacent to upper ends of the grooves of the expansion unit, said flange portions being respectively engageable with the recesses of the extension unit when the connecting members are respectively engaged into said aligned grooves.

4. An expandable housing assembly as claimed in claim 1, wherein said basic unit is submultiple in height to the expansion unit.

* * * * *

UNITED STATES PATENT AND TRADEMARK OFFICE
CERTIFICATE OF CORRECTION

PATENT NO.: 5,706,965
DATED: January 13, 1998
INVENTORS: Honma et al.

It is certified that error appears in the above-identified patent and that said Letters Patent is hereby corrected as shown below.

On the face of the Patent, under the Foreign Application Priority Data section, please correct the priority date as follows:
change "Sept. 19, 1996" to --Sept. 19, 1995--.

Signed and Sealed this

Fourteenth Day of April, 1998

Attest:

BRUCE LEHMAN

*Attesting Officer*      *Commissioner of Patents and Trademarks*